(12) United States Patent
Gajadharsing et al.

(10) Patent No.: US 7,652,316 B2
(45) Date of Patent: Jan. 26, 2010

(54) SEMICONDUCTOR TRANSISTOR (DMOS) DEVICE FOR USE AS A POWER AMPLIFIER

(75) Inventors: Radjindrepersad Gajadharsing, Nijmegen (NL); Thomas Christian Roedle, Nijmegen (NL); Petra Christina Anna Hammes, Nijmegen (NL); Stephan Jo Cecile Henri Theeuwen, Nijmegen (NL)

(73) Assignee: DSP Group Switzerland AG, Zurich (CH)

( * ) Notice: Subject to any disclaimer, the term of this patent is extended or adjusted under 35 U.S.C. 154(b) by 274 days.

(21) Appl. No.: 10/551,324

(22) PCT Filed: Apr. 21, 2004

(86) PCT No.: PCT/IB2004/050474

§ 371 (c)(1),
(2), (4) Date: Oct. 18, 2005

(87) PCT Pub. No.: WO2004/095577

PCT Pub. Date: Nov. 4, 2004

(65) Prior Publication Data

US 2006/0220154 A1  Oct. 5, 2006

(30) Foreign Application Priority Data

Apr. 22, 2003 (EP) ................... 03101096

(51) Int. Cl.
*H01L 29/76* (2006.01)
*H01L 21/8234* (2006.01)

(52) U.S. Cl. ............ 257/296; 257/401; 257/343; 257/E29.111; 438/238

(58) Field of Classification Search ........ 257/288, 257/296, 392, 330, 335, 341, 343, 401
See application file for complete search history.

(56) References Cited

U.S. PATENT DOCUMENTS 5,477,068 A * 12/1995 Ozawa ............... 257/214

(Continued)

FOREIGN PATENT DOCUMENTS

DE 28 55 844 A 6/1980

(Continued)

OTHER PUBLICATIONS

International Search Report, mailed Nov. 3, 2004, International Patent Application No. PCT/IB2004/050474, 2 pages.

*Primary Examiner*—Wael Fahmy
*Assistant Examiner*—Sarah K Salerno
(74) *Attorney, Agent, or Firm*—Knobbe, Martens, Olson & Bear, LLP

(57) ABSTRACT

The invention relates to in particular a lateral DMOST with a drain extension (8). In the known transistor a further metal strip (20) is positioned between the gate electrode contact strip and the drain contact (16) which is electrically connected with the source region contact (15). In the device proposed here, the connection between the further metal strip (20) and the source contact (15,12) comprises a capacitor (30) and the further metal strip (20) is provided with a further contact region (35) for delivering a voltage to the further metal strip (20). In this way an improved linearity is possible and the usefulness of the device is improved in particular at high power and at high frequencies. Preferably the capacitor (30) is integrated with the transistor in a single semiconductor body (1). The invention further comprises a method of operating a device (10) according to the invention.

10 Claims, 5 Drawing Sheets

U.S. PATENT DOCUMENTS

| | | | | |
|---|---|---|---|---|
| 5,578,860 | A * | 11/1996 | Costa et al. | 257/528 |
| 5,898,198 | A * | 4/1999 | Herbert et al. | 257/319 |
| 6,069,386 | A * | 5/2000 | Jos | 257/339 |
| 6,215,152 | B1 * | 4/2001 | Hebert | 257/340 |
| 6,294,798 | B1 * | 9/2001 | Zambrano | 257/71 |
| 6,870,219 | B2 * | 3/2005 | Brech | 257/340 |
| 2002/0003247 | A1 * | 1/2002 | Yokoyama et al. | 257/296 |
| 2002/0033508 | A1 * | 3/2002 | Morikawa et al. | 257/368 |
| 2003/0057463 | A1 * | 3/2003 | Otabe et al. | 257/295 |

FOREIGN PATENT DOCUMENTS

EP    0 309 748  A    4/1989

* cited by examiner

SEMICONDUCTOR TRANSISTOR (DMOS) DEVICE FOR USE AS A POWER AMPLIFIER

The invention relates to a semiconductor device comprising a semiconductor body which is provided with a field effect transistor at a surface and which comprises strongly doped source and drain zones and a channel region extending between the source zone and the drain zone, with a gate electrode being present which overlaps the channel region upon perpendicular projection thereon, wherein the source zone, the drain zone and the gate electrode are connected at the surface to a metal source contact, a drain contact and a gate electrode contact, respectively, and wherein a further metal strip is positioned between the gate electrode contact and the drain contact, which metal strip is insulated from the semiconductor body, is locally electrically connected to the source strip and forms a shield between the gate electrode and the drain contact. Such a device may be used to advantage as a (high) power amplifier, in particular for a transmitter in the high-frequency range of wireless communication. The presence of the shield between the gate electrode contact and the drain contact leads to a significant capacity reduction between the drain contact and the gate electrode, which in turn leads to a significant power amplification increase at higher frequencies.

Such a device, which may be constructed both in discrete and in integrated form, is known from U.S. Pat. No. 6,069,386, which was published on 30 May 2000. The known device comprises a lateral metal oxide semiconductor-type transistor. The transistor is formed in a weakly doped p-type epitaxial layer on a strongly doped p-type substrate. The channel is defined in a p-type zone which is implanted into the epitaxial layer in a self-aligned manner with respect to the polycrystalline silicon gate electrode. The source and drain zones may have an interdigitated structure, the number of digits being chosen, for example, in dependence on the maximum electric current to be accommodated. The drain extension serves to increase the breakdown voltage between source and drain, as is generally known. Since the metal source contact is not arranged above but beside the gate electrode, the gate electrode can be provided with a metal connection over its entire length, so that the gate resistance is determined by the layer resistance of the metal, and accordingly it can be kept very low through the use of a suitably conductive metal. The contacts are in the form of parallel metal strips arranged side by side. Since the further metal strip and the metal contact of the gate electrode can be manufactured in the same metal layer as the source and drain contacts, relatively few process steps are necessary for the manufacture thereof.

One drawback of the known device is the fact that it does not have a linear characteristic, in particular at very high frequencies. As a result, the maximum usable power is limited.

Accordingly, the object of the present invention is to provide a device of the kind referred to in the introduction, which is highly linear, also at high frequencies, and which is capable of providing a high power level.

According to the invention, a semiconductor device of the kind referred to in the introduction is characterized in that the electrical connection between the further metal strip and the source contact comprises a capacitor, and in that the further metal strip is provided with a connecting contact for applying an external voltage to the further metal strip. The invention is in the first place based on the recognition that the provision of a capacitor in the connection between the further metal strip and the contact source enables the application to the further metal strip of a voltage which is different from the voltage of the source region. In order to enable the application of such a voltage to the further metal strip, said metal strip is according to the invention provided with a connecting contact. The invention is furthermore based on the recognition that the linearity of the device can be significantly improved by applying such a voltage to the further metal strip. This is based on the recognition that the device according to the invention may be considered to comprise two field effect transistors, namely a first enhancement-type transistor, which is associated with the gate electrode, and a second depletion-type transistor, whose further metal strip forms the gate electrode, as it were. Since the former transistor operates in the so-termed common source configuration in the device according to the invention, and the latter transistor operates in the so-termed common gate configuration, the two transistors operate in a cascade (=series connected) configuration and exhibit opposite phase distortion which enables phase extinction and thus less distortion. Said further contact region makes it possible, through the application of an external voltage, to set the power level at which the aforesaid extinction takes place. This enables optimization of the linearity in dependence on the selected use of the device.

The capacitor may be externally connected to the device. A device which is ready for use is normally provided with an insulating envelope of plastic material, from which a number of terminal pins, four terminal pins in an advantageous embodiment of a device according to the invention, extend. The capacitor may be bonded to the enveloped device, for example, and be connected to the terminal pins for the source region and for the further metal strip.

In an advantageous embodiment, the capacitor is integrated in the semiconductor body and is positioned within the active region beside the transistor. Such a device is easy and inexpensive to manufacture. Preferably, the source contact, the drain contact, the gate electrode contact, the further metal strip and the connecting contact thereof and an electrode of the capacitor are formed of two separate metal layers arranged one above the other, which are separated from each other by a further insulating layer.

Such a two-metal layer process makes it possible to connect the further metal strip to the (one) electrode of the capacitor at several positions, which connections cross the gate electrode contact. The use of a large number of such connections is advantageous with a view to lowering the impedance for the operating frequency between the further metal strip and the capacitor electrode. Another important aspect of such a two-metal layer process is the fact that two adjacent gate electrode digits may be connected via the upper layer of the two metal layers. Each digit may be connected to a conductor track in the upper metal layer by means of a conducting via. In that case a conducting digit will be present—in the upper metal layer—between two adjacent gate electrodes, to which digits the conductor tracks of the two adjacent gate electrodes that lead to a via are connected. The conducting digit is connected to the contact region for the gate electrode, crossing the underlying source contact, which is interrupted at the location of said crossing so as to reduce the capacity. Preferably, two adjacent gate electrodes are connected to the conducting digit at several positions in this manner. For technical reasons, each gate electrode is preferably widened at the location of said connection. The advantage of such a connection of the gate electrode to the gate electrode connecting region is that the connecting resistance of the gate electrode may be low, whereas the width thereof may nevertheless be relatively small. Preferably, in order to reduce said resistance, the polycrystalline silicon of the gate electrode, too, has been partially converted into a silicide, such as a titanium silicide.

In another variant, the other electrode of the capacitor is formed by the semiconductor body, which comprises a strongly doped substrate, on which a more weakly doped epitaxial layer is present. The substrate is connected to a metal layer, which also forms a connection for the source region.

In an advantageous variant, the two electrodes of the capacitor form part of the metal layers, and the lower electrode of said two electrodes is electrically connected to the semiconductor body, which comprises a strongly doped region at that location. In this way a voltage-independent operation of the capacitor can readily be realized, which is advantageous. In this case silicon nitride may be used as the dielectric of the capacitor. Another advantage of such a capacitor is the fact that a higher capacity per unit area can be achieved, thus enabling a reduction of the surface area that is taken up by a capacitor having a given capacity. The strongly doped region comprises, for example, the substrate and a more strongly doped (by means of a local diffusion) portion of a (more weakly doped) epitaxial layer present on the substrate.

The capacitance of the capacitor partially depends on the desired frequency. Preferably it ranges between 10 pF and 1 nF at an operating frequency ranging between 100 MHz and 3 GHz. Since a device according to the invention can be used with higher power levels than the prior art device, a device according to the invention is preferably provided with a heat sink, which preferably comprises copper and/or tungsten-copper parts.

The invention may be used to advantage in (n-channel or p-channel) transistors, in which the channel is formed by a surface region of the semiconductor body, and in which the channel is separated from the gate electrode by means of an electrically insulating layer. A preferred embodiment of a device according to the invention is characterized in that the transistor is of the lateral DMOS type, in which D stands for "double diffused". The invention is also suitable for use in other transistors, however, such as MESFET's, and in particular HEMT's, which are based on a semiconductor body of a III-V material, such as GaAs or GaN. Furthermore it is advantageous if a heat sink is present on the side of the semiconductor body remote from the surface.

Preferably, a minimum spacing is used between the further metal strip and the gate electrode contact. This makes it possible to influence other characteristics of the transistor as well via the voltage on the strip. Preferably, this takes place in an independent manner, with another metal strip—which is likewise insulated from the semiconductor body—being present between the further metal strip and the gate electrode, which other strip is connected in the same manner as in the prior art device, for example. Said other strip may furthermore be connected in the same manner as the further metal strip in the device according to the invention. In that case the other transistor characteristics can be influenced through the application of a different external voltage to the other metal strip, independently of the voltage being applied to the further metal strip.

The invention furthermore comprises a method of operating a device according to the invention, in which a voltage is applied to the contact region of the further metal strip during operation of the device. The applied voltage may be dynamically controlled, that is, the voltage that is applied in the higher power region is different from the voltage that is applied in the lower power region. According to another possibility, a gradually changing, power-dependence voltage is advantageously applied. In this variant, use is preferably made of the capacitor that is entirely formed in the two metal layers. Such a capacitor can be more easily connected to a circuit that is integrated in the device, by means of which a specific voltage function can be applied.

The above and further aspects of the invention will now be explained in more detail by means of an embodiment. In the drawing.

Figure 1:
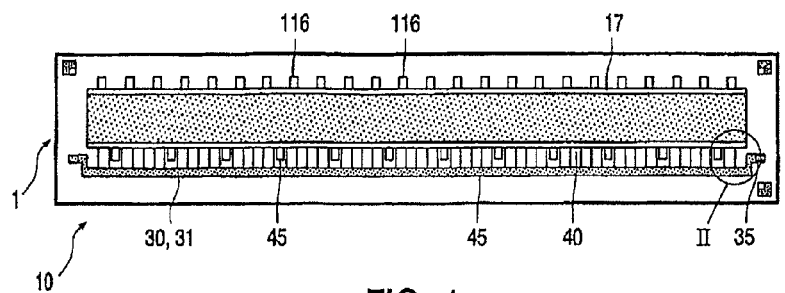
FIG. 1 is a top plan view of a semiconductor device according to the invention.
Figure 2:
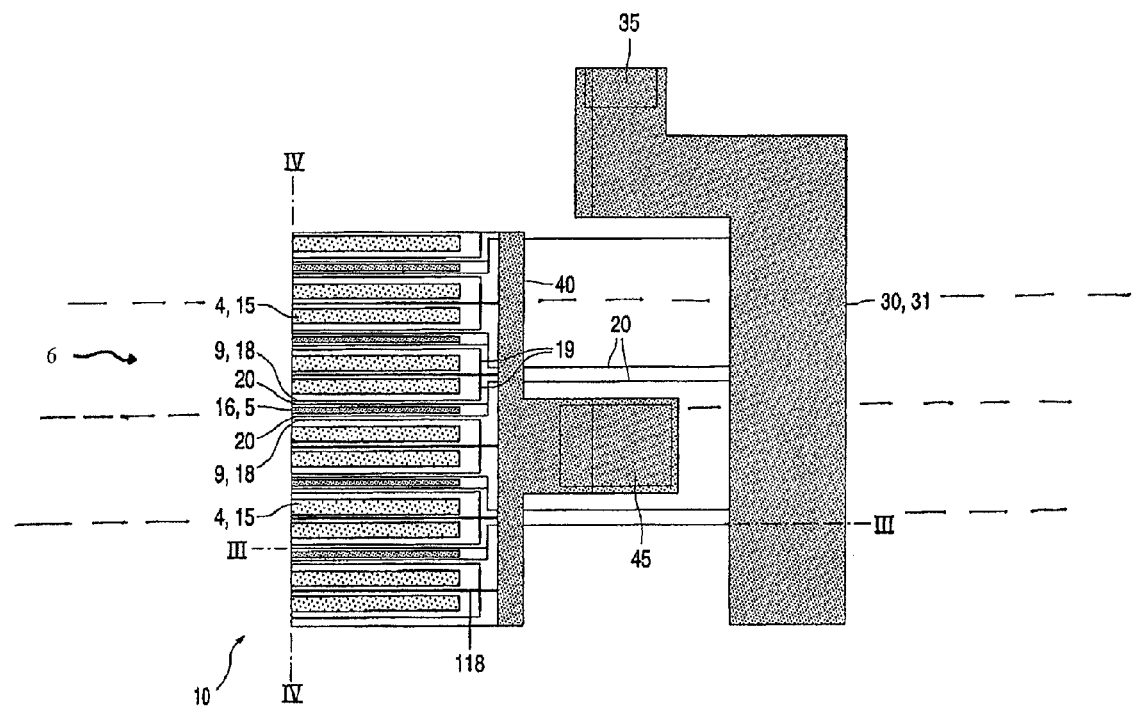
FIG. 2 is a top plan view of an enlarged portion, indicated II in FIG. 1, of the device of FIG. 1.
Figure 4:
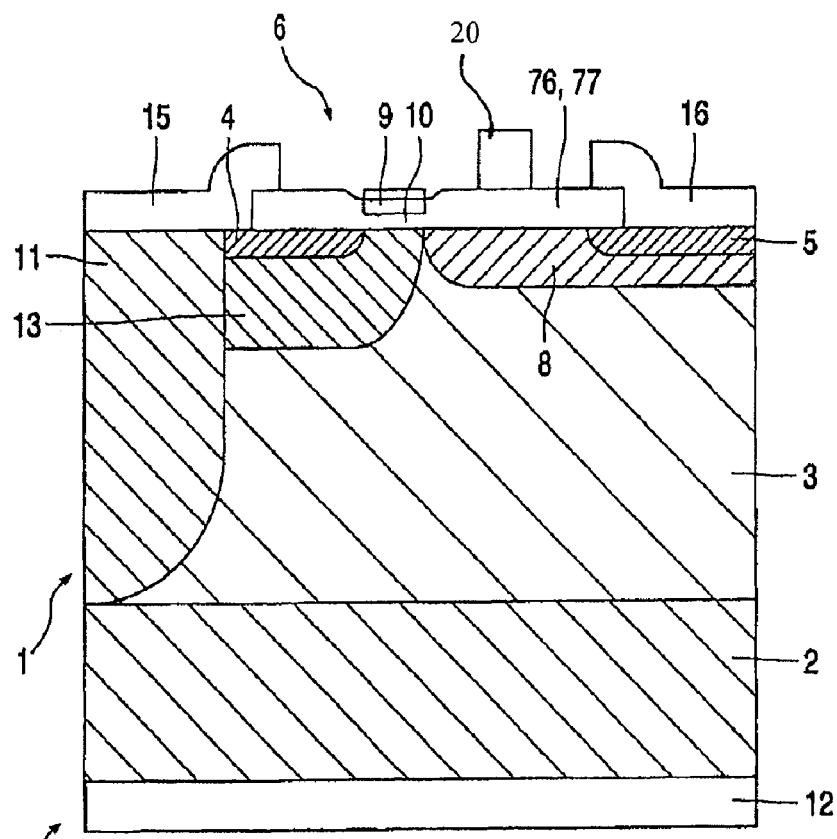
FIG. 4 is a sectional view of this device along the line IV-IV.
Figure 5:
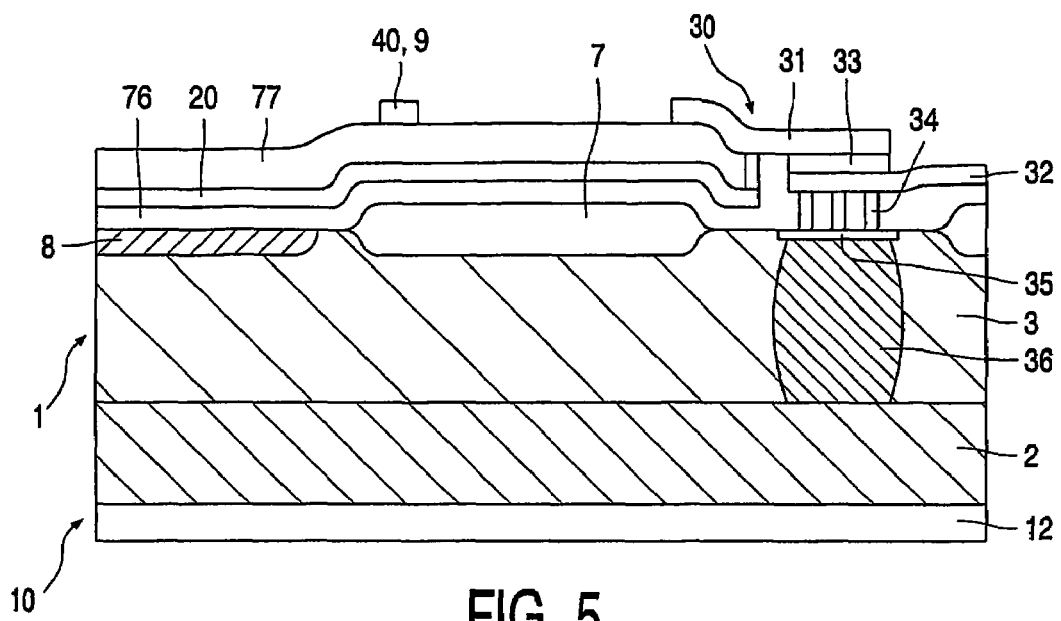
FIG. 5 is a sectional view of a variant of this device along the line III-III.

It is noted that the drawing is merely diagrammatic and not drawn true to scale. It is further noted that the metallization pattern is mainly shown in FIG. 1 and FIG. 2. Parts which lie at a lower level are not shown in FIG. 1 and FIG. 2, but only in the sectional views of FIG. 3, FIG. 4 and FIG. 5 for the sake of clarity. As regards the central portion of FIG. 1, a detail view as shown in FIG. 2 provides a better understanding of the interdigitated structure of the transistor.

Figure 3:
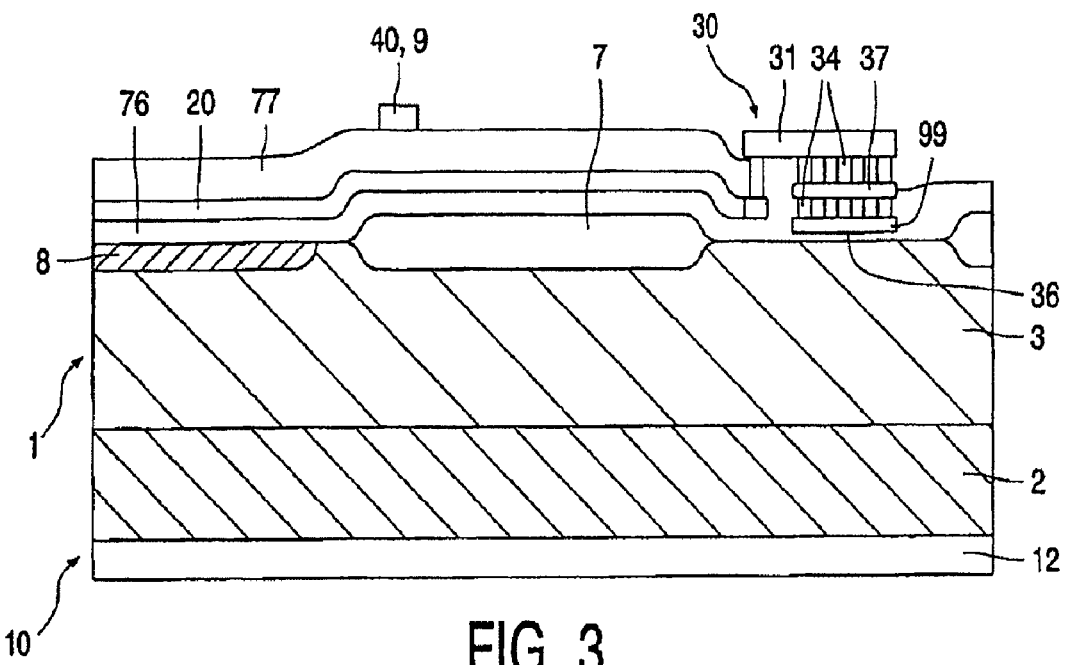
FIG. 3 is a sectional view of this device along the line III-III.

The device (see FIGS. 1-4) comprises a semiconductor body 1, which is made of silicon in this example, but which may also be made of another suitable semiconductor material, of course. It is provided with an insulating layer 76 of silicon dioxide. The semiconductor body is built up of a low-ohmic, strongly doped p-type substrate 2 and a comparatively weakly doped, high-ohmic region 3 adjoining the surface of the silicon body, in which the transistor is accommodated. In this example, the region 3 is formed by a p-type epitaxial layer having a thickness of approximately 7 µm and a doping concentration of approximately $5.10^{15}$ atoms per $cm^3$. The doping concentration of the substrate 2 which functions as a connection for the source zone is high, for example between $10^{19}$ and $10^{20}$ atoms per $cm^3$. An active region 6 is defined in the epitaxial layer, which region is laterally bounded by thick field oxide 7. Source and drain zones of the transistor are provided in the active region in the form of strongly doped n-type surface zones 4 and 5, respectively. The transistor comprises a multi-digit structure comprising a number of source/drain digits lying beside one another, which are only shown schematically (FIG. 1) or in part (FIG. 2) in the drawing. The multi-digit structure may be obtained in a simple manner, for example by extending the portion that is shown in FIG. 3 to the left and to the right until the desired channel width is obtained. To increase the breakdown voltage, the drain zone 5 is provided with a high-ohmic n-type drain extension 8 between the drain zone 5 and the channel of the transistor. The length of the extension is 3.5 µm in this example. The transistor channel is formed by the p-type region 13 between the extension 8 and the source zone 4. A gate electrode 9 is provided above the channel, which gate electrode is separated from the channel by a gate oxide 10 having a thickness of, for example, 70 nm. The gate electrode 9 is formed by strips of strongly doped, approximately 0.3 µm thick polycrystalline silicon (poly) overlaid with approximately 0.2 µm titanium silicide, which, seen at the surface, extends transversely over the active region 6 between the source zones 4 and the drain extensions 8. The source zone (or zones) 4 is (are) short-circuited with the p-type region via a deep, strongly doped p-type zone 11 which extends from the surface down to the strongly doped substrate and which connects the source zone 4 to the source electrode 12 at the lower side of the substrate via the substrate 2. The transistor is embodied as an LDMOST, so that it can be operated at a sufficiently high voltage, for which purpose an additional p-type doping is provided in the channel in the form of the diffused p-type zone 13, so that the doping concentration is locally increased as compared with the weak epi doping.

The surface is coated with a thick glass layer, in which contact windows are provided above the source and drain zones, through which windows the source and drain zones are connected to metal source and drain electrodes 15 and 16, respectively. As is apparent from the plan view of FIG. 2, the contacts 15 and 16 are formed by metal strips extending parallel to each other over the glass layer. The source contact 15 is not only connected to the source zone(s), but also to the deep p-type zone 11, and thus interconnects the source zone and the connection 12 at the bottom side of the substrate. The source zone may be connected to external connections via this connection. The drain electrode strips 16 (FIG. 1) form a comb structure together with the base portion 17, they may be connected to a number of bond pads 116 present elsewhere on the crystal via the common portion 17.

The gate electrode 9 of the device is also provided with a metal contact, which extends in the form of a strip 118 over the oxide layer between the metal strips 15 and 16, and which is locally connected to the gate 9 via contact windows in the oxide layer. The metal track 18 is not connected to the gate 9 over its entire length, but only in a number of interspaced locations, at which the poly gate 9 is provided with widened portions suitable for connections 19, only one of which—for each gate electrode 9—is shown. If the interspacings between the connections 19 are sufficiently small, the gate resistance is significantly reduced by the presence of the metal tracks 118. The resistance of the gate electrode is also reduced by the presence of titanium silicide thereon. A very low gate resistance can be obtained through the use of a metal having a low resistivity, for example gold or aluminum. As is shown in FIG. 2, the polysilicide (in this example) track of the gate electrode has a comb shape which forms an interdigitated structure with the drain electrode 16, 17. The base of the comb of the gate electrode metal tracks 118 is a metal strip 40, which is provided with evenly spaced bond pads 45 for the gate electrode 9. Adjacent gate electrodes 9 are interconnected, for example in three places—only one of which is shown in FIG. 1—at the location of connections (not shown in the figure) of the gate electrode 9. In that case a metal track 118, which is connected to the base portion 40 of the gate electrode, extends centrally over said connections. The metal strip 15 of the source region 4 is interrupted at the location of said track 118 so as to reduce the capacitance with the track 118.

Further metal tracks 20 are provided between the polysilicide tracks 18 of the gate electrode 9 and the Al tracks 16 of the drain contact. Said tracks 20 are connected to an electrode 31 of a capacitor 30 and also to a connecting bond pad 35, where an external voltage is applied during operation of the device 10. The (partially interconnected) shielding tracks 20 are connected to the capacitor 30 at evenly spaced positions, said tracks being formed in the lower layer of the two metal layers 20,18 that are separated from each other by means of an insulating silicon dioxide layer 77. The use of a two-metal layer process makes it possible for the metal tracks 20 to cross the gate electrode 9,18. This makes it possible to connect metal tracks 20 having a minimum resistivity. In this example, another electrode of the capacitor 30 is formed by the portion of the semiconductor body 1 that is present under a thin oxide layer 36, in this case a portion of the epitaxial layer 3 and the substrate 2, which electrode is connected to the source connection 12, therefore. The upper electrode 31 is connected, via metal plugs 34 and an additional metal layer 37 incorporated therein, to a polycrystalline silicon region 99 present on the oxide layer 36 and to the further metal strip 20. In this example, the capacity is 100 pF.

According to the invention, distortion compensation may occur upon presentation of an external voltage to the contact region 35 in the device 10 of this example, owing to the fact that the device comprises two transistors, as it were, an enhancement-type transistor and a depletion-type transistor. As a result, the device exhibits an improved linearity and operation at higher power levels is possible in comparison with the prior art device. It has been found that a suitable external voltage on the metal tracks 20 is about +25 V. All this will be illustrated hereinafter in the discussion of FIGS. 6-8.

In a very advantageous variant of the device 10 discussed herein (see FIG. 5), use has been made in the forming of the capacitor 30 of the fact that the device has been formed by means of a two-metal layer process. The lower electrode 32 is formed in the first (lower) metal layer, whilst the upper electrode 31 is formed in the second (upper) metal layer. Present between the two layers is a dielectric of, for example, silicon nitride having a thickness of 100-500 nm. The lower electrode 32 is connected, via metal plugs 34 in an insulating layer, to a silicide region 35 at the surface of the semiconductor body 1, which is further provided with a strongly doped (p-type) semiconductor region 36 at that location. The main advantages of this variant are the fact that a higher capacity value per unit area is possible, and that consequently the surface area of the capacitor 30 may be smaller. The capacity of the capacitor 30 is further substantially independent of the voltage. A final advantage is the fact that the capacitor 30 can easily be connected as a series capacitor, via the lower electrode 32, to a circuit (preferably integrated therewith) capable of applying a power-dependent voltage, for example, to the metal tracks 20. This enables a further improvement and optimization of the distortion and thus use of the device at even higher power levels.

Figure 6:
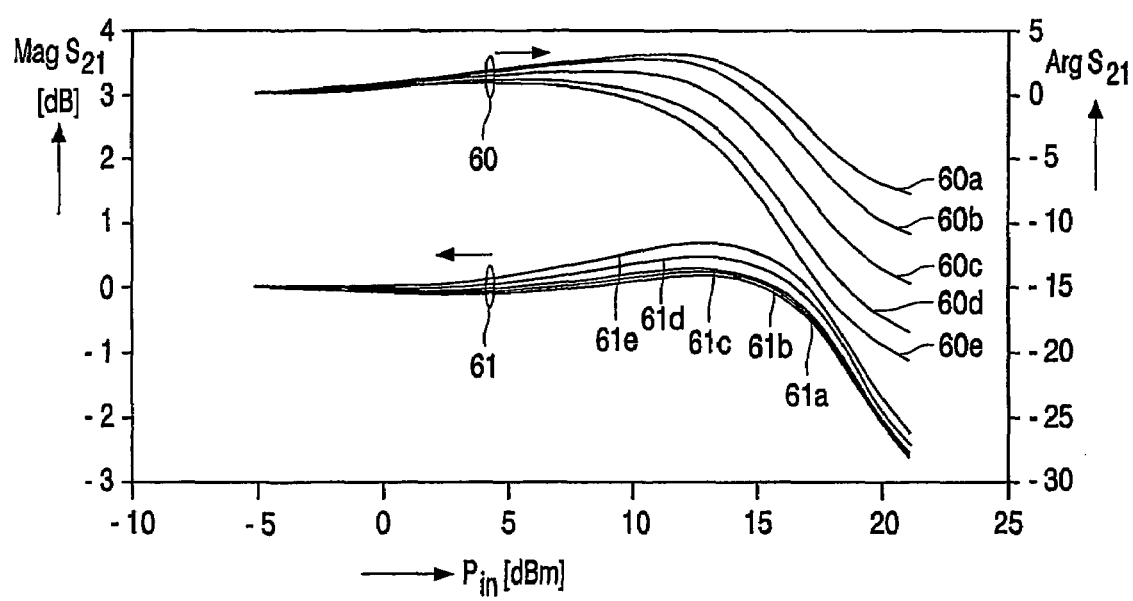
FIG. 6 shows magnitudes illustrating the amplitude and phase linearity of the device of FIG. 1 as a function of the input power.

FIG. 6 shows the magnitude S21 as a function of the input power. This complex magnitude S21 is also known as the large signal transducer gain, and it characterizes the linearity of a device, in this case the device of FIG. 1. The large signal gain S21 is defined as the ratio between the forward wave at the output and the forward wave at the input and can be represented as $r.e^{j*\phi}$. In the figure, the upper group of curves 60 represent the normalized argument (ArgS21) of S21, and the lower group of curves 61 represent the magnitude (Mag 21) of S21 as a function of the input power Pin. The drain-source voltage Vds is 26 V, and the frequency f is 2 GHz. The curves 61a-61e and 60a-60e show the changes in a voltage on the further metal tracks 20, which changes take place in steps (step size is 10 V) from +20 V to −20 V. The magnitude MagS21 only depends on the voltage on the metal tracks 20 to a small extent. The magnitude ArgS21, however, exhibits a strongly improved profile (curve 60a) for a voltage of +20 V on the aforesaid metal tracks 20. The (phase), distortion of a device according to the invention—during operation—has been significantly improved in comparison with the prior art device, therefore.

Figure 7:
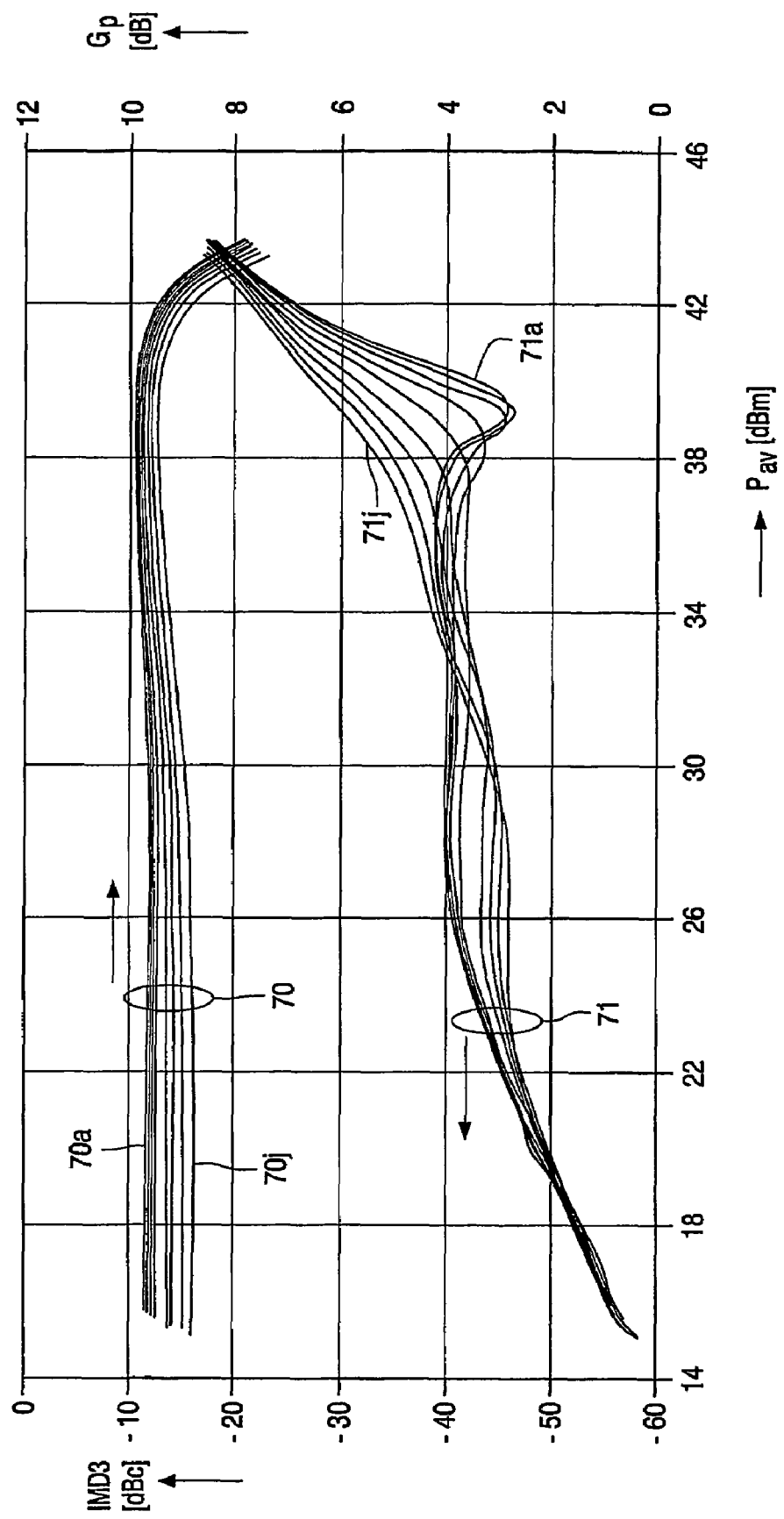
FIG. 7 shows a distortion factor and the amplification of the device of FIG. 1 as a function of the average power.

FIG. 7 shows a distortion characterizing factor and the gain of the device of FIG. 1 as a function of the average power. The upper group of curves 70 represent the gain Gp as a function of the average power Pav and the lower group of curves 71 represent the intermodulation distortion IMD3 for a two-tone system, wherein f1=2,000 GHz and f2=2,001 GHz. Vds is likewise 26 V, and the voltage on the gate electrode 9 is 4.70 V. The curves 70a-70j and 71a-71j represent the changes in a voltage on the further metal tracks 20, which changes take place in steps (step size is 5 V) from +25 V to −25 V. The influence of the aforesaid voltage on the gain Gp is small. A significant improvement of IMD3—at higher power levels— is realized, however, when the aforesaid voltage is approximately +25 V.

Figure 8:
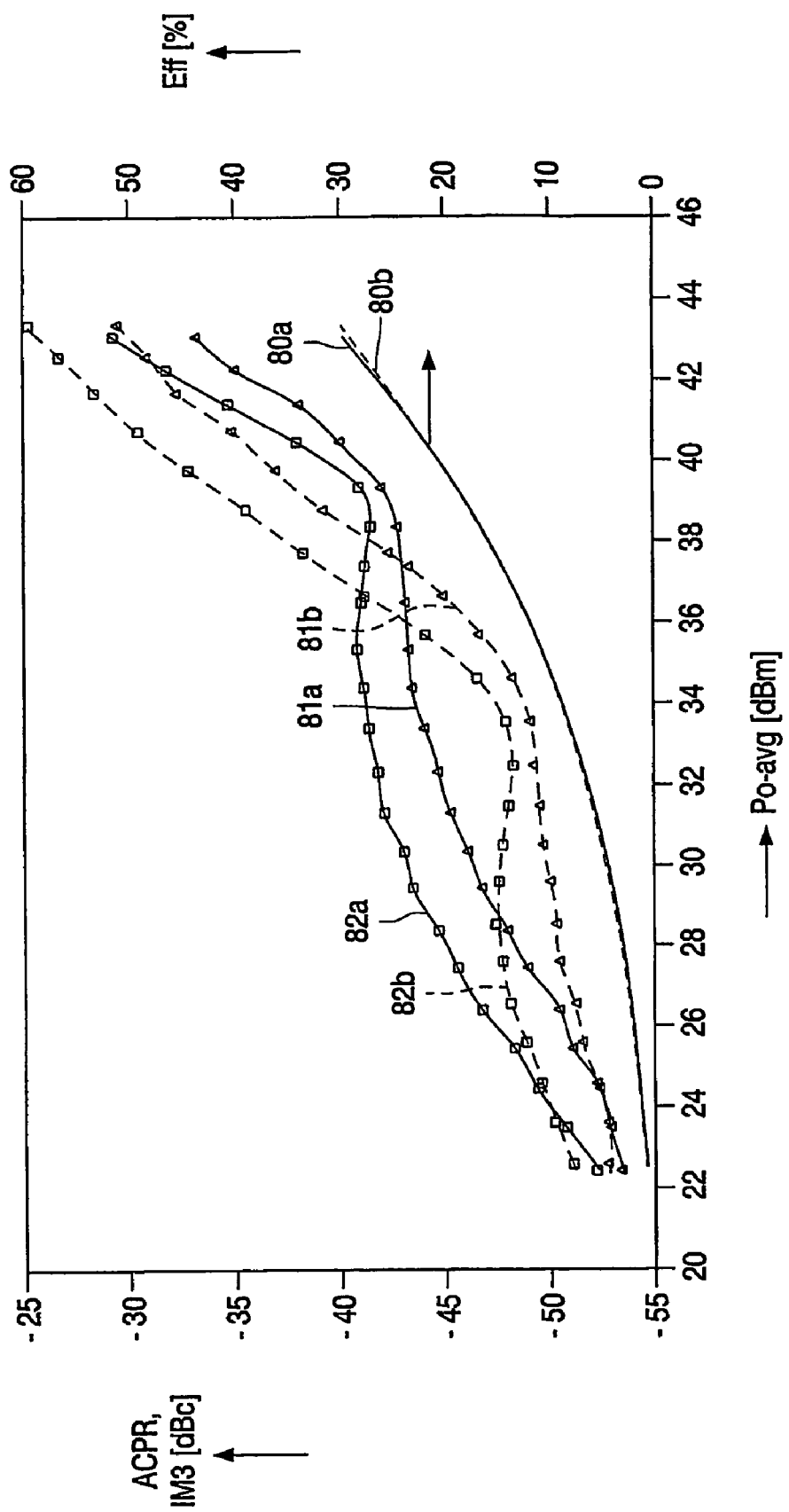
FIG. 8 shows two the distortion factors and the efficiency of the device as a function of the average power.

FIG. 8 shows two distortion factors and the efficiency of the device as a function of the average power. A two-carrier WCDMA (=Wideband Code Division Multiple Access) system is concerned here. Curve 80a represents the efficiency (Eff) for a voltage on the metal tracks 20 of +25 V, whilst said voltage is 0 V for the curve 80b. The aforesaid voltage has practically no effect on the efficiency, therefore. The curves 81a and 81b represent the ACPR (=Adjacent Power Ratio) for a metal strip 20 voltage of +25 V and 0 V, respectively. The curves 82a and 82b represent the magnitude IM3 for corresponding voltages on the further metal strip 20. FIG. 8 shows that the distortion characterizing magnitudes ACPR and IM3 improve significantly at high power levels for a two-carrier system, too, for a voltage on the further metal strip 20 of +25 V. This figure also illustrates that it may be useful to make the aforesaid voltage dependent on the power level. Thus, the aforesaid voltage may be lower at lower power levels than at higher power levels. The change may take place in steps or continuously, and in both cases it may be applied by a circuit which has been added to the device and which is preferably integrated therewith.

It will be apparent that the invention is not limited to the embodiment described herein, but that many more variations are possible to those skilled in the art within the scope of the invention. Thus the invention may also be used to advantage in p-channel MOS transistors. The invention may furthermore be used not only in DMOS-type transistors, but also in MOS transistors in which the channel is formed by a surface region of the epitaxial layer 3, possibly with additional Vt implantation, instead of a diff-used zone. Furthermore it is possible to use the invention in transistors of the so-termed VDMOS type, wherein V stands for vertical, and wherein the channel and the gate electrode still extend (at least substantially) parallel to the surface of the semiconductor body, indicated by the term "semi-lateral" in the present application. Although use in truly vertical MOS transistors, in which the channel and the gate electrode extend substantially perpendicularly to the surface of the semiconductor body, for example in/on the side wall of a groove in said surface, is in itself conceivable, such use is not practically feasible, given the present state of the technology.

Although the device according to the invention preferably comprises a silicon semiconductor body, the invention may also be used in devices made of other semiconductor materials, such as GaAs or other so-termed III-V materials.

It is further noted that while mention is only made of a discrete semiconductor element in the embodiment described herein, the invention is also suitable for the manufacture of other integrated semiconductor products, which may comprise a larger number of active semiconductor elements.

It is further noted that the transistor may be used to great advantage in the 0.5-5 GHz range, in particular in the 0.9-2.4 GHz range, within which range the major frequency bands for mobile communication lie, and that it is suitable for power amplification at lower and also at higher source-drain voltages, such as 20-30 V, for example.

The invention claimed is:

1. A semiconductor device comprising a semiconductor body which is provided with a field effect transistor at a surface and which comprises strongly doped source and drain zones and a channel region extending between the source zone and the drain zone, with a gate electrode being present which overlaps the channel region upon perpendicular projection thereon, wherein the source zone, the drain zone and the gate electrode are connected at the surface to a metal source contact, a drain contact and a gate electrode contact, respectively in the form of metal strips, and wherein a further metal strip is positioned between the gate electrode contact and the drain contact, which further metal strip is insulated from the semiconductor body, is locally electrically connected to the metal source contact, and forms a shield between the gate electrode and the drain contact, characterized in that the electrical connection between the further metal strip and the metal source contact comprises a capacitor, and in that the further metal strip is provided with a connecting contact for applying an external voltage to the further metal strip.

2. The semiconductor device as claimed in claim 1, characterized in that the capacitor is integrated in the semiconductor body and is positioned within the active region beside the transistor.

3. The semiconductor device as claimed in claim 2, characterized in that the source contact, the drain contact, the gate electrode contact, an electrode of the capacitor and the connecting contact thereof, are formed in a first metal layer, and the further metal strip is formed in a second metal layer arranged below the first metal layer, and wherein the first and second layers are separated from one another by a further insulating layer.

4. The semiconductor device as claimed in claim 3, characterized in that the other electrode of the capacitor is formed by the semiconductor body, which comprises a strongly doped substrate on which a more weakly doped epitaxial layer is present.

5. The semiconductor device as claimed in claim 3, characterized in that the two electrodes of the capacitor form part of the metal layers, and the lower electrode of said two electrodes is electrically connected to the semiconductor body, which comprises a strongly doped region at that location.

6. The semiconductor device as claimed in claim 1, characterized in that the capacitance value of the capacitor ranges between 10 pF and 1 nF at an operating frequency ranging between 100 MHz and 3 GHz.

7. The semiconductor device as claimed in claim 1, characterized in that the field effect transistor is a MOS transistor, in which the semiconductor body comprises a comparatively weakly doped region of a first conductivity type adjoining the surface, which region is provided with the strongly doped source and drain zone of the opposed, second conductivity type and a weakly doped drain extension between the drain zone and the channel region, wherein the gate electrode is electrically insulated from the channel region and an electrically insulating layer is laid over the surface, which layer is provided with contact windows above the source zone, the drain zone and the gate electrode, through which contact windows the source zone, the drain zone and the gate electrode, respectively, are connected to the contacts.

8. The semiconductor device as claimed in claim 1, characterized in that the metal strips serving as the contacts of the source zone, the drain zone and the gate electrode are embodied as parallel metal strips positioned beside each other.

9. A method of operating a semiconductor device as claimed in claim 1, wherein a voltage is applied to the contact region of the further metal strip during operation of the device.

10. The method as claimed in claim 9, characterized in that the applied voltage is selected independent of the power range within which the device operates.

* * * * *

UNITED STATES PATENT AND TRADEMARK OFFICE
CERTIFICATE OF CORRECTION

PATENT NO. : 7,652,316 B2  Page 1 of 1
APPLICATION NO. : 10/551324
DATED : January 26, 2010
INVENTOR(S) : Gajadharsing et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 566 days.

Signed and Sealed this

Twenty-eighth Day of December, 2010

David J. Kappos
*Director of the United States Patent and Trademark Office*